United States Patent [19]
Murray

[11] Patent Number: 5,477,153
[45] Date of Patent: Dec. 19, 1995

[54] ELECTROMAGNETIC PULSE COUPLING NETWORK

[75] Inventor: Robert M. Murray, Los Lunas, N.M.

[73] Assignee: Honeywell Inc., Minneapolis, Minn.

[21] Appl. No.: 261,363

[22] Filed: Jun. 16, 1994

[51] Int. Cl.$^6$ ................................................ G01R 27/04
[52] U.S. Cl. ...................... 324/627; 324/628; 333/24 R
[58] Field of Search ..................................... 333/24 R, 25; 324/627, 628, 539, 543

[56] References Cited

U.S. PATENT DOCUMENTS

| 2,446,195 | 8/1948 | Shive | 324/627 |
| 2,881,389 | 4/1959 | Quine | 324/627 |
| 4,425,542 | 1/1984 | Tsaliovich | 324/627 |
| 4,647,844 | 3/1987 | Biegon | 324/627 |
| 4,931,720 | 6/1990 | Garbe | 324/627 |
| 4,973,911 | 11/1990 | Marshall | 324/628 |

Primary Examiner—Kenneth A. Wieder
Assistant Examiner—Jose M. Solis
Attorney, Agent, or Firm—Donald Lenkszus; Kenneth Johnson

[57] ABSTRACT

A coupling network for electromagnetic pulsed testing arrangements includes three stacks of toroidal ferrite cores. Two of the stacks are of identical diameter, the third stack has a diameter approximately equal to the combined diameters of the first two stacks. A copper tube looped through the central aperture of the first two stacks forms a primary winding. An insulated wire looped twice through the first two apertures forms a secondary winding of a 1:2 step-up transformer. The winding is extended through the aperture of the third stack. The third stack is operable to permit the laying in of a cable connected to a device under test. The cable forms the secondary of an isolation transformer.

17 Claims, 2 Drawing Sheets

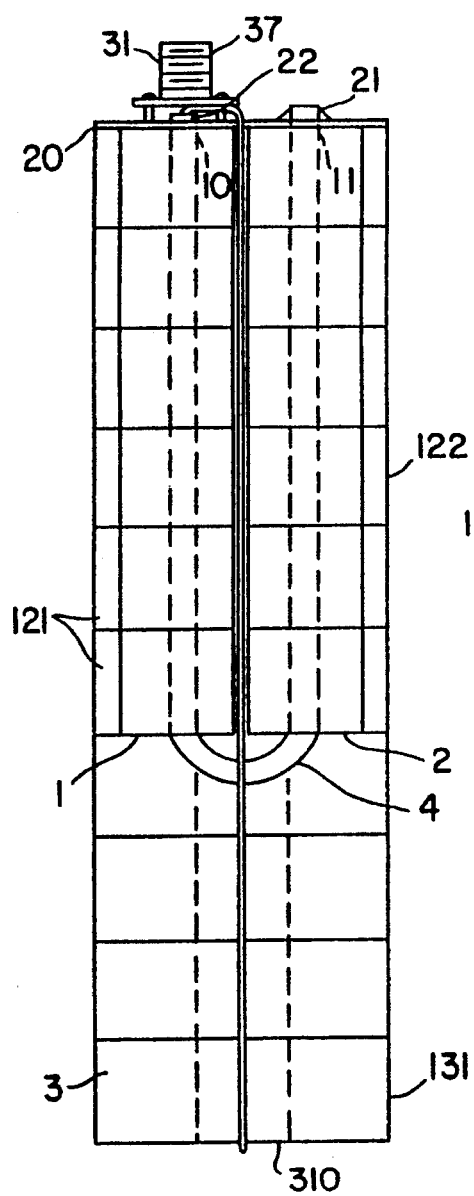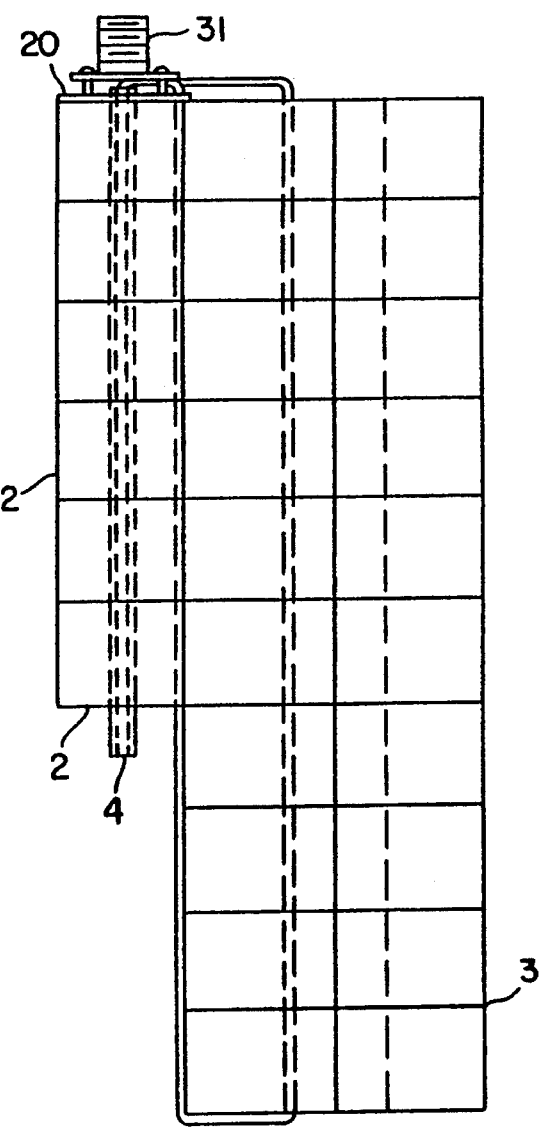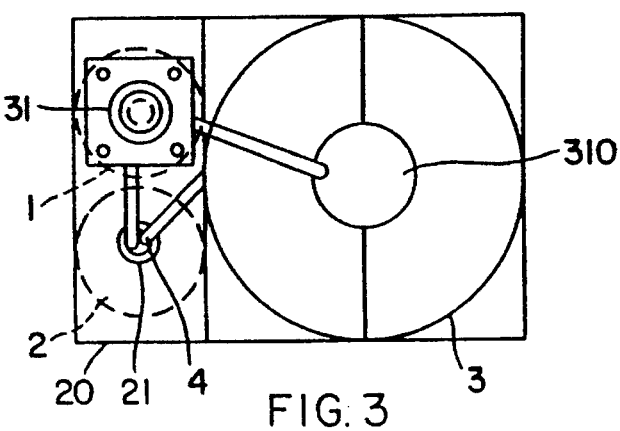

ELECTROMAGNETIC PULSE COUPLING NETWORK

BACKGROUND OF THE INVENTION

This invention pertains in general to testing apparatus and more specifically to apparatus for electromagnetic pulse (EMP) testing.

It is often desirable to test electronic equipment, systems and subsystems for susceptibility to severe electromagnetic environments. Likewise, it is desirable to determine the effectiveness of protective devices and electromagnetic radiation hardening measures.

Two approaches to EMP testing are typically used. EMP testing may be done through full illumination testing of the equipment under test in a large simulator. This is a traditional manner of EMP testing, but its limited availability and high cost makes it inappropriate for many users. A second approach which is typically more reasonably priced and versatile is to perform the testing on individual subsystems or line replaceable units.

In the second approach, high-level electrical stimulus is directly applied to individual elements of the system at predictable points of entry. In "Linear Amplifiers for Direct-Drive Testing" by Michael E. Gruchalla, ITEM 1990, R & B Enterprises, pp. 82–96 (1990), various testing arrangements are described. As pointed out in the Gruchalla article, the direct application of electrical stimulus or "direct-drive testing" has been made feasible for two reasons. First, by using direct-drive, the test levels required are much lower than those needed for total system illumination. Second, the historical record of full illumination provides a basis for predicting the electromagnetic stresses in specific applications.

Recent changes in military and commercial EMP test requirements have been developed. Specifically, MIL-STD-461C added four tests, CS10, CS11, CS12 and CS13, to the existing military standard MIL-STD-461B. The tests set forth in these standards are similar to those of the new commercial standard DO-160C Section 22. In all these tests, it is required that a high energy pulse be applied to the unit under test to simulate lightening or other EMP. Certain of these testing arrangements attempt to simulate EMP coupling to cables and antennas. This technique may be referred to as direct-drive bulk injection.

Pulsed power sources generate EMP pulses in a test set-up. Two different approaches to provide a pulsed-powered source are generally used. The first and most common is the use of a tuned LC network. By charging a high energy capacitor and then discharging it into an inductor, pulses meeting the test parameters can be created. One limitation to this approach is that the frequency and decay rate of the resulting damp sinusoid waveform are fixed. Any change in waveform requirements results in a separate tuned high voltage circuit. Thus, this method can be very expensive where it is necessary to meet multiple test requirements.

A second approach utilizes a broad bandwidth linear RF amplifier driven by a signal generator capable of creating various waveforms within its bandwidth. The limitation of this technique is the relative higher cost of providing higher powered amplifiers as compared to the energy storage system.

In either test method, a coupling transformer is commonly utilized to couple the test signal to a cable. In the past, such transformers have typically been in the nature of isolation transformers with a 1:1 transform ratio.

Under the requirements of MIL-STD-461C, there are both voltage and current limits on the waveform to be applied to the device under test. Ideally, a generator with a known source impedance (typically 200 ohms) would drive the cable under test with the open circuit amplitude set at the voltage limit. Depending on the impedance of the cables, a corresponding voltage and current will be generated. Unfortunately, keeping a constant source impedance in the 10 KHz to 100 MHz frequency range is difficult, if not impossible. An alternative method is to determine which signal lines are high impedance and which are low impedance and then test them according to the voltage or current limit, whichever is most appropriate. This method will satisfy the test requirements without concern for the source impedance provided both the required voltage and current can be generated by the test equipment. Broadband amplifiers are typically considered to have a 50 ohm output impedance. However, they typically, in fact, vary from 10's of ohms at the low frequencies to 100's of ohms at the higher frequencies and change under different Load conditions. Achieving the current limit of MIL-STD-461C is not difficult due to the relatively low impedance of the amplifier and the ease of adding currents to the primary of the coupling transformer to step up the current. Developing the voltage is more difficult. In the past, a very high powered amplifier was required which was capable of directly generating the necessary voltage.

SUMMARY OF THE INVENTION

In accordance with the principles of the invention, a testing system includes a broadband amplifier having its output coupled to a line under test by means of a transformer which steps up the voltage. The transformer operates both as a step-up and a coupling transformer for coupling damped sinusoid waveforms over a range of 1:100 MHz.

In accordance with the invention, a network for coupling EMP signal to a cable is formed from three stacks of toroidal cores. Two of the stacks are identical and the third stack is of approximately the combined diameters of the first two stacks. The third stack is split to permit opening of the stack and insertion of a cable connected to the equipment under test. A primary winding for connection to a pulse source is formed threading a conductor through the central aperture of the first and second stacks of cores. A secondary winding is threaded at least twice through the central apertures of the first and second stacks. The winding is extended to the central aperture of the third stack, and then through the third stack aperture.

The windings in the apertures of the first two stacks form a 1:2 step-up transformer, and the winding in the third stack forms the primary of a 1:1 coupling transformer to the cable which is inserted therein.

BRIEF DESCRIPTION OF THE DRAWINGS

The invention will be better understood from a reading of the following detailed description taken in conjunction with the drawings in which:

FIG. 1 is a first end view of a device in accordance with the principles of the invention;

FIG. 2 is a side view of the device of FIG. 1;

FIG. 3 is a top view of the device of FIG. 1;

DETAILED DESCRIPTION

FIGS. 1 through 4 show an illustrative damped sine wave coupling network in accordance with the invention. The network forms a combined step-up and coupling transformer. The network comprises three stacks, 1, 2, 3 of toroidal core sections of types commercially available. Such core materials are available, for example, from Ceramic Magnetics. In the illustrative embodiment, the material for each core section is identical ferrite material of high Mu, i.e., Mu=1600. Core stacks 1 and 2 are of the same diameter. Core stack 3 is of a larger diameter approximately equal to the sum of the diameters of stacks 1 and 2. All cores are the same material and in the illustrative embodiment utilize Ceramic Magnetics CMD5005 material. That material has a stated core permeability Mu 1600. Ferrite core material is preferable because of its outstanding performance at the frequencies of interest here.

Figure 4:
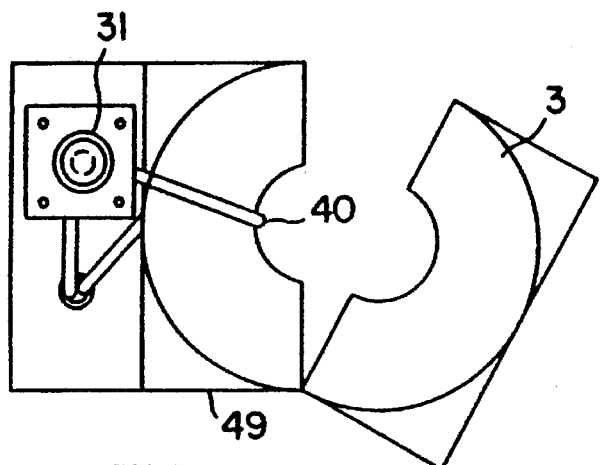
FIG. 4 is a top view of the device of FIG. 1 opened to receive a cable.
Figure 5:
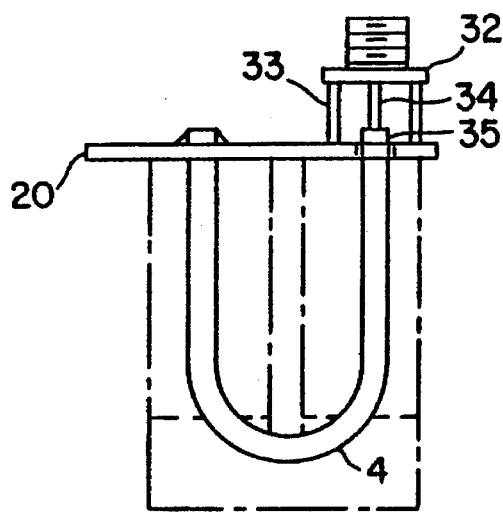
FIG. 5 illustrates in detail a portion of the device of FIGS. 1 through 4.

Core stacks 1 and 2 form, along with their windings, a step-up transformer. These stacks include center apertures 10, 11 through which a copper tube 4 which forms a primary winding of a transformer T1 is positioned. At the top of the core stacks 1, 2 a copper plate 20 is provided. Copper plate 20 includes apertures 21 and 22 which respectively receive ends of the copper tube 4. As best seen in FIG. 5, copper tube 4 extends through the apertures 21, 22 and is soldered to copper plate 20 at aperture 21, but isolated from copper plate 20 at aperture 22. A coaxial connector 31 is positioned over aperture 11 by means of standoff mounts 33 which mechanically and electrically connect to the copper plate 20. The mounts 33 establish an electrical connection between the body 37 of connector 31 and the copper plate 20. The center conductor pin 34 of coaxial connector 31 is soldered to the isolated end of the copper tube 4. An insulated wire 40 which is threaded through the core stacks as described below forms secondary of transformer T1.

Each of the core stacks 1 and 2 include the same number of toroidal cores 121, 122. In the illustrative embodiment, each core is 1.25" in diameter, 0.29" thick and the central aperture is 0.25". The cross-section of each core is 3.19 cm.

Core stack 3 comprises 10 cores 131 each 3" in diameter, 1" thick and having a 1" diameter aperture 310. These cores are split so that the core stack may be opened such that the cable or wires under test may be placed in the core aperture. As will be understood by those skilled in the art, the hinged housing 401 for the apparatus shown in FIGS. 1 through 4 is not shown in detail, but consists primarily of a box which is hinged or latched at points corresponding to the halves of core stack 3. The magnetic material used in core stack 3 is identical to that used in core stacks 1 and 2.

Conductor 40 is the PFTE insulated center conductor of a coaxial cable which forms the secondary of transformer T1. The wire 40 extends into the copper tube 4 through stack 1, up through stack 2 back down through stack 1, up again through stack 2 and from that point, extends to core stack 3 extending along the exterior surface thereof to the bottom of stack 3 and up through the central aperture 310 back to the starting end of the wire 40. FIG. 5 illustrates in greater detail the arrangement in which the center conductive tube 24 is soldered to plate 20 and the connection of coaxial connector to plate 20. The winding configuration is perhaps more easily understood with reference to FIG. 6 wherein it can be seen that the cores 1, 2 and wire 40 extending therethrough in conjunction with the copper tube 4, forms a transformer T1 which is coupled to a transformer T2, the primary winding of which is formed by that portion of the wire 40 which extends through a central aperture 310 of the core stack 3.

With this arrangement, an input signal waveform which is 530 $v_{rms}$ at the coaxial connector 31 will produce a peak-to-peak voltage waveform at 3,000 volts in a conductor 79 laid into the aperture of core stack 3.

Figure 6:
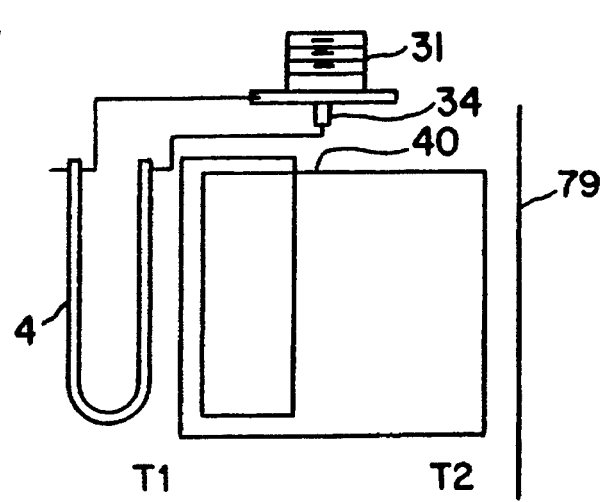
FIG. 6 is a schematic drawing of the transformer windings of the device of FIG. 1.
Figure 7:
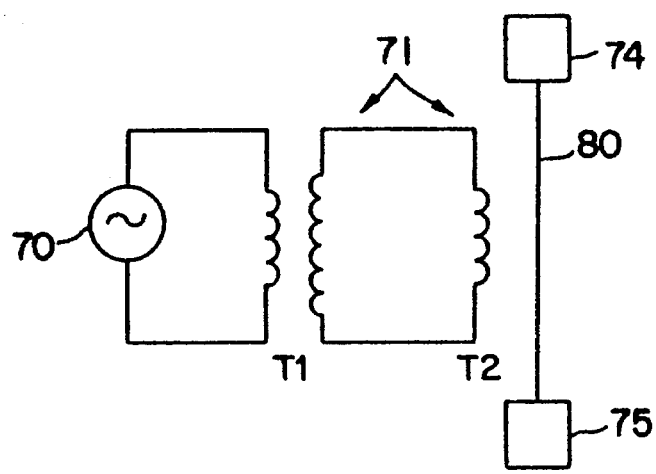
FIG. 7 is a schematic drawing of a testing arrangement utilizing the device of FIGS. 1 through 4.

Turning now to FIG. 7, the use of the coupling network in a test configuration is shown. In the arrangement of FIG. 6, a pulse generator 70 provides test waveforms to a coupling device 71 which is constructed in accordance with FIGS. 1–4. The coupling device is snapped around a cable 80 which forms the secondary of transformer of T2 and connects between support equipment 74 and a device under test 75.

This invention has been described herein in considerable detail in order to comply with the Patent Statutes and to provide those skilled in the art with the information needed to apply the novel principles and to construct and use such specialized components as are required. However, it is to be understood that the invention is not restricted to the particular embodiment that has been described and illustrated, but can be carried out by specifically different equipment and devices, and that various modifications, both as to the equipment details and operating procedures, can be accomplished without departing from the scope of the invention itself.

The embodiments of the invention in which an exclusive property or right is claimed are defined as follows:

1. A network for coupling EMP test signals to a cable, said network comprising:

a first stack of a first plurality of toroidal shaped cores, said first stack having a central aperture;

a second stack of a second plurality of toroidal shaped cores, said second stack having a central aperture;

a third stack of a third plurality of toroidal shaped cores, said third stack having a central aperture;

said third stack being substantially equal in diameter to the sum of the diameters of said first and second stacks, said third stack being split substantially parallel to its longitudinal axis to form first and second portions to be opened to thereby accommodate the placement of a cable into the central aperture of said third stack;

said first and second stacks being placed adjacent to each other and both being placed adjacent to said third stacks;

a primary winding wound through the apertures of said first and second stacks; and a secondary winding through the apertures of said first and second stacks and being wound such that said primary and secondary windings of said first and second stacks form a step-up transformer, said secondary winding extending through the aperture of said third stack to form a primary winding therein which is coupleable to said cable.

2. A network in accordance with claim 1, wherein:

said primary winding of said first and second stacks comprises a conductive tube extending through both said first and second stack apertures.

3. A network in accordance with claim 2, comprising:

means for coupling said primary winding of said first and second stacks to a source of EMP signals.

4. A network in accordance with claim 3, wherein:

said secondary winding said first and second stacks is wound through said conductive tube.

5. A network in accordance with claim 3, wherein:

said means comprises a coaxial connector, said connector having a body portion adapted to be coupled to the shield of coaxial cable, said conductive tube being connected to said connector body portion.

6. A network in accordance with claim 5, comprising:

a conductive plate extending over the top of said first and second stacks, said plate having a first aperture in alignment with said first stack aperture, and having a second aperture in alignment with said second stack aperture, said conductive tube extending through said plate first and second apertures and being in conductive connection to said plate at said first and second apertures.

7. A network in accordance with claim 6, wherein:

said second winding of said first and second stacks comprises a conductor insulated with a high dielectric constant insulator material forming a loop extending twice through said conductive tube and continuing through the aperture of said third stack to form said primary winding of said third stack.

8. A network in accordance with claim 1, wherein:

each toroidal core of said first, second and third stacks comprises identical ferrite material, and the number of cores in each of said first, second and third stacks is selected such that the magnetic densities in all cores of said first, second and third stacks is substantially the same.

9. A test arrangement for testing apparatus for susceptibility to EMP by coupling signals to a cable connected to said apparatus, said arrangement comprising:

a source of damped sine wave signals; and a network for coupling said source to said cable, said network comprising:

a first stack of a first plurality of toroidal shaped cores, said first stack having a central aperture;

a second stack of a second plurality of toroidal shaped cores, said second stack having a central aperture;

a third stack of a third plurality of toroidal shaped cores, said third stack having a central aperture;

said third stack being substantially equal in diameter to the sum of the diameters of said first and second stacks, said third stack being split substantially parallel to its longitudinal axis to form first and second portions to be opened to thereby accommodate the placement of a cable into the central aperture of said third stack;

said first and second stacks being placed adjacent to each other and both being placed adjacent to said third stack;

a primary winding wound through the apertures of said first and second stacks;

a secondary winding wound through the apertures of said first and second stacks and being wound such that said primary and secondary windings of said first and second stacks form a step-up transformer, said secondary winding extending through the aperture of said third stack to form a primary winding therein which is coupleable to said cable.

10. An arrangement in accordance with claim 9, wherein:

said primary winding of said first and second stacks comprises a conductive tube extending through both said first and second stack apertures.

11. An arrangement in accordance with claim 10, comprising:

means for coupling said primary winding of said first and second stacks to a source of EMP signals.

12. An arrangement in accordance with claim 11, wherein:

said secondary winding of said first and second stacks is wound through said conductive tube.

13. An arrangement in accordance with claim 11, wherein:

said means comprises a coaxial connector, said connector having a body portion adapted to be coupled to the shield of coaxial cable, said conductive tube being connected to said connector body portion.

14. An arrangement in accordance with claim 13, comprising:

a conductive plate extending over the top of said first and second stacks, said plate having a first aperture in alignment with said first stack aperture, and having a second aperture in alignment with said second stack aperture, said conductive tube extending through said plate first and second apertures and being in conductive connection to said plate at said first and second apertures.

15. An arrangement in accordance with claim 14, wherein:

said primary winding of said first and second stacks comprises a conductor with a high dielectric constant insulator material extending from said connector twice through said conductive tube and continuing through the aperture of said third stack and back to said connector body to form said primary winding of said third stack.

16. An arrangement in accordance with claim 9, wherein:

each toroidal core of said first, second and third stacks comprises identical ferrite material, and the number of cores in each of said first, second and third stacks is selected such that the magnetic densities in all cores of said first, second and third stacks is substantially the same.

17. A network in accordance with claim 9 wherein:

said primary and secondary windings of said first and second shacks step up the voltage of said waveform by twice its amplitude.

* * * * *